United States Patent [19]

Haag

[11] Patent Number: 5,753,089

[45] Date of Patent: May 19, 1998

[54] SPUTTER COATING STATION

[75] Inventor: Walter Haag, Grabs, Switzerland

[73] Assignee: Balzers Aktiengesellschaft, Furstentum, Liechtenstein

[21] Appl. No.: 673,155

[22] Filed: Jun. 25, 1996

[30] Foreign Application Priority Data

Jun. 28, 1995 [CH] Switzerland ............ 01 898//95-1

[51] Int. Cl.$^6$ .................... C23C 14/34; C23C 14/35
[52] U.S. Cl. ................. 204/192.12; 204/298.11; 204/298.15; 204/298.23; 204/298.24; 204/298.25; 204/298.26
[58] Field of Search ............ 204/192.12, 298.11, 204/298.15, 298.23, 298.24, 298.25, 298.26

[56] References Cited

U.S. PATENT DOCUMENTS

| 3,250,694 | 5/1966 | Maissel et al. | 204/298.09 |
| 3,728,246 | 4/1973 | Barkhudarov et al. | 204/298.16 |
| 4,530,750 | 7/1985 | Aisenberg et al. | 204/298.24 |
| 4,558,388 | 12/1985 | Graves, Jr. | 360/135 |
| 4,842,704 | 6/1989 | Collins et al. | 204/192.24 |
| 4,915,805 | 4/1990 | Rust | 204/192.12 |
| 5,229,358 | 7/1993 | Kumar | 505/434 |

FOREIGN PATENT DOCUMENTS

| 0546251 | 7/1992 | European Pat. Off. | 204/298.07 |
| 2441448 | 3/1975 | Germany | 204/298.23 |
| 4202211 | 7/1993 | Germany | 204/298.19 |
| 62-294174 | 12/1987 | Japan | 204/192.26 |
| 63-121657 | 5/1988 | Japan | 204/298.25 |
| 2228268 | 8/1990 | United Kingdom | 204/298.08 |

OTHER PUBLICATIONS

European 0489239 of Jun. 1992.

Primary Examiner—Aaron Weisstuch
Attorney, Agent, or Firm—Notaro & Michalos PC

[57] ABSTRACT

A sputter coating station has a pair of opposing sputter sources. At least one of the sources encompasses a clear opening through which a workpiece mounting arrangement holding a workpiece can move for positioning the workpiece through the opening. A process for sputter coating workpieces uses the sputter coating station and includes holding the workpiece by a workpiece holder through the opening and into the coating chamber, and coating the workpiece using the sputtering sources.

27 Claims, 9 Drawing Sheets

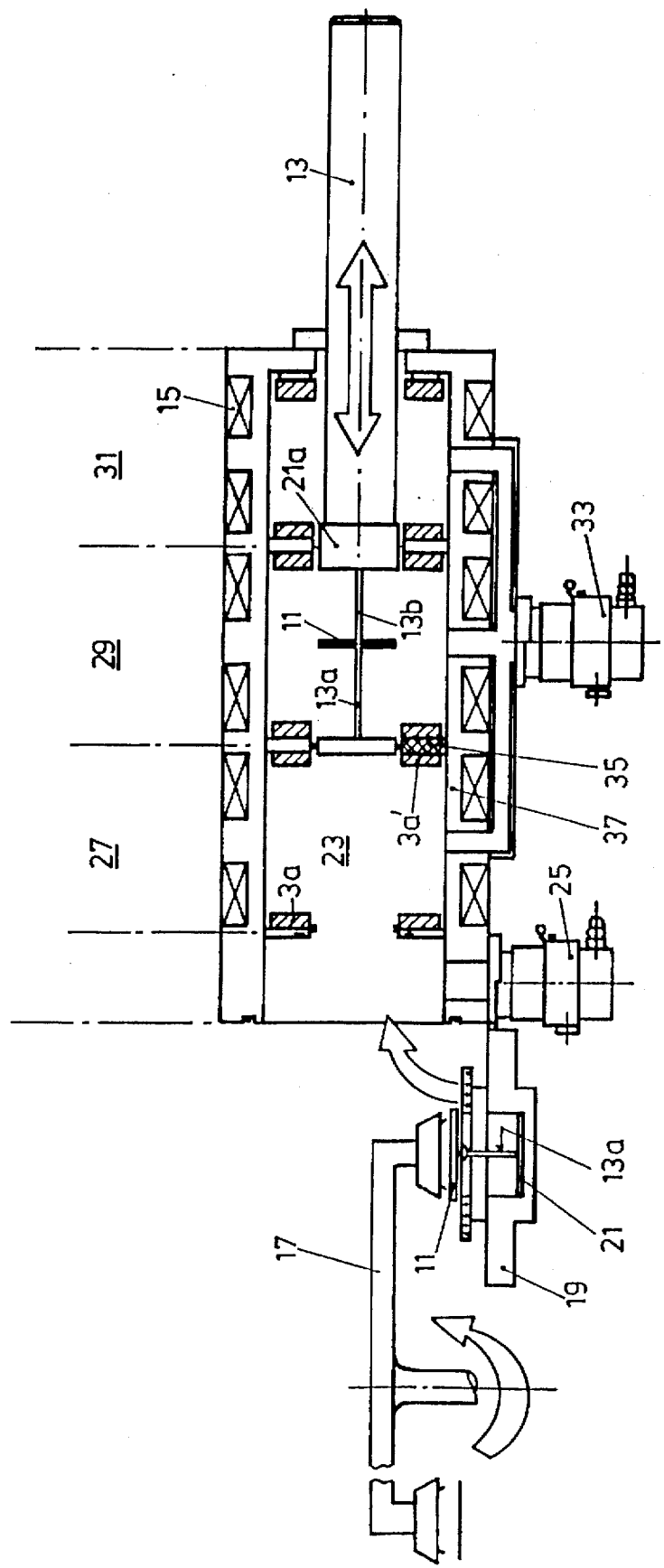

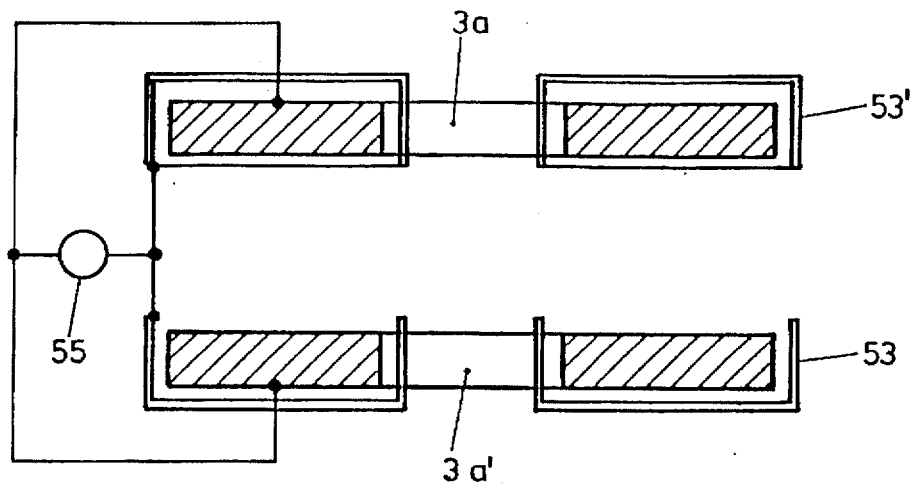
FIG. 7
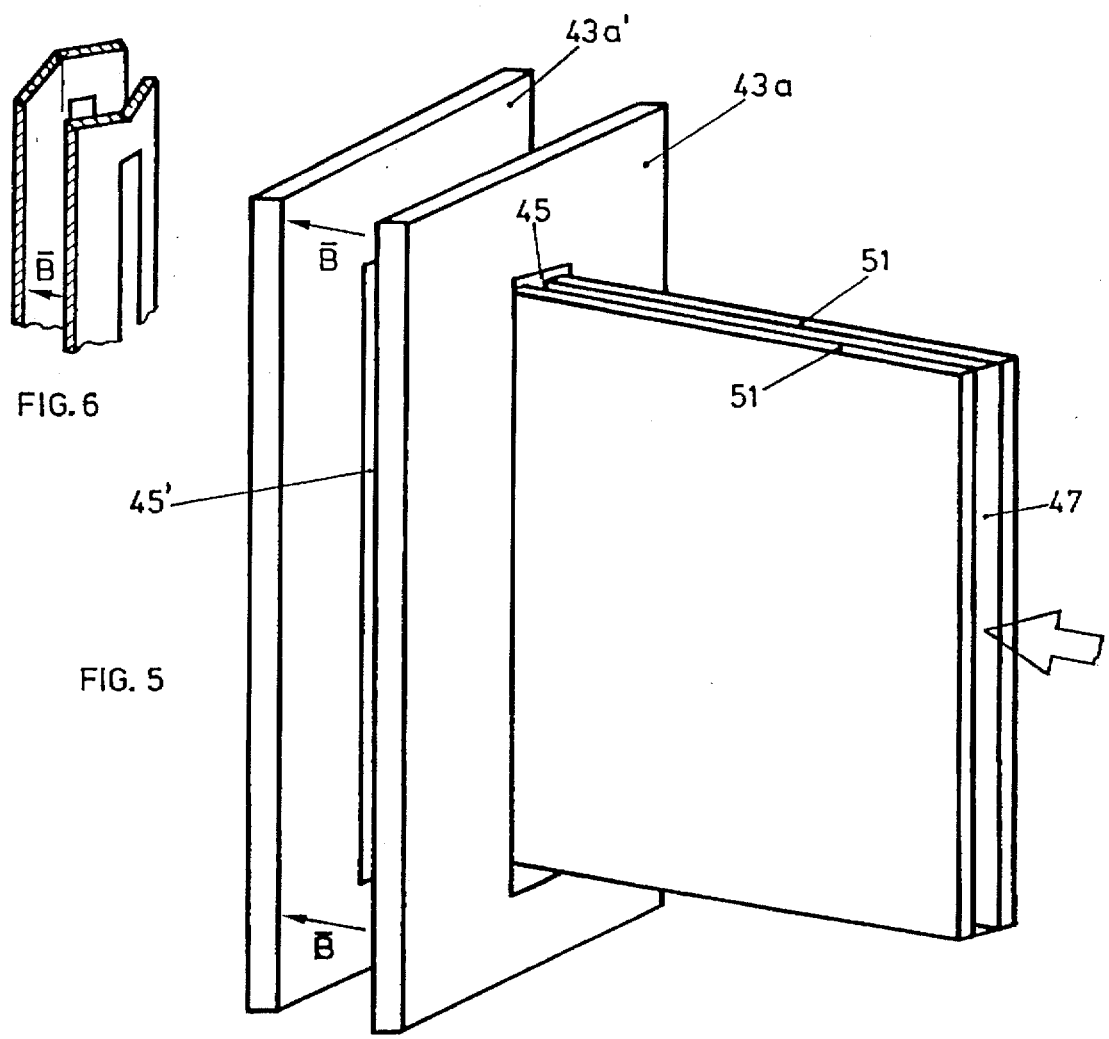
FIG. 6
FIG. 5

SPUTTER COATING STATION

FIELD AND BACKGROUND OF THE INVENTION

The present invention relates to a sputter coating station with a pair of opposing sputter sources.

Definition

In the following, the term "target" means the plate to be vaporized and also the entire source.

Sputter coating stations with a pair of opposing sputter sources (vaporization sources) are known from U.S. Pat. No. 4,407,894, European Patent Document EP-A-0 273 685, German Patent Document DE-A-39 31 212, as well as from the article "RF and DC discharge characteristics for opposed-targets sputtering", M. Matsuoka et al., J. Appl. Phys. 60(6), Sep. 15, 1986.

The workpieces to be coated in these references are disposed outside of the volume defined by the opposing sputter sources. This fundamental procedure is inter alia disadvantageous because the workpieces are disposed outside of the plasma region defined by the opposing sputter sources and thus relatively far away from the targets assigned to the sources, which yields correspondingly low coating rates.

This also leads to relatively voluminous stations because, in addition to the volume between the sputter sources, space must be provided for mounting as well as introducing and removing the workpieces.

Moreover, a homogeneous layer thickness distribution along the workpiece surfaces disposed to the side of the volume can only be attained with difficulty because the spacing from the target areas of the surface regions to be coated vary along the surface to be coated. Utilization of the target material is also relatively poor in two respects. For one, utilization is poor because central target surface regions contribute only little to the coating and the targets in this region essentially coat each other; for another, because the central target regions are per se less sputter-eroded than peripheral regions.

U.S. Pat. No. 4,558,388 as well as European Patent Document EP-A-0 546 251 disclose sputter coating stations of the above described type, i.e. comprising a pair of opposing sputter sources. Here workpieces to be coated are introduced into the volume defined by the sputter sources and, specifically, are slid in laterally. This permits simultaneous coating of workpieces on all sides, in particular of disk-shaped workpieces on both sides.

A disadvantage in this last described procedure is that the stations configured in this way are voluminous because on a side of the volume between the sputter sources and corresponding to the transport range for the workpiece transport arrangements, projecting drive units must be provided. Moreover, attaining a homogeneous layer thickness distribution is here also only realizable with difficulties because, as is known, the opposing essentially planar target surfaces are not eroded uniformly, i.e. less in the central region than in the peripheral region. Concomitant therewith, the target material is poorly utilized. In addition, two power supplies are necessary since the discharges of both sources are initiated separately.

SUMMARY OF THE INVENTION

The present invention addresses the problem of developing a sputter coating station of the above described type by means of which workpieces can furthermore be coated on all or both sides simultaneously, and which is constructed compactly,
on which the target material of the sputter sources is better utilized, and
on which improved homogeneity of the layer thickness distribution can be attained, in particular on disk-shaped workpieces.

This is attained in that at least one of the sputter sources encompasses a clear opening and a carrier arrangement for positioning a workpiece centrally with respect to the source, is provided. In this way, the following is basically achieved:

Workpieces can continue to be introduced into the volume between the sputter sources and can consequently be simultaneously coated on all or both sides.

The capability is provided to reach through said opening with a workpiece transport arrangement and thus no laterally projecting transport or drive means need be provided. Therein a workpiece disk with its surface parallel or perpendicularly to the encompassed opening can be slid into or through the volume defined between the targets. It is also possible to slide such disk laterally between the targets and mount it there in position by securing elements centrally disposed in the opening.

Since at least one of the sputter sources with the clear opening can only include sputter surfaces along a frame-like structure, the target material is better utilized since the central region which is conventionally sputtered-off less on a continuous planar target, is no longer present.

Because the sputter surface with the opening or at least partially with the opening is, in turn, sputter-eroded relatively homogeneously, an improved layer thickness homogeneity results, in particular on the surfaces of planar, disk-shaped workpieces.

It is possible to provide for each target, tunnel-shaped magnetic fields and/or magnetic fields extending from target to target. The plasma ring discharge can therein be peripherally significantly more intensive outside of the workpiece region than in the region of the centrally disposed workpiece and/or a magnetic field can be applied in the workpiece region homogeneously and/or parallel to the disk surface of the workpiece.

Magnetic targets can be used as pole shoes of the magnetic field extending from target to target without needing to be operated in magnetic saturation.

Because of the plasma discharge, implemented annularly about the opening, it is possible to avoid exposing sensitive substrates, such as those comprising PMMA or lacquered substrates, so that thereon only condensation energy acts.

Preferred embodiments of the sputter coating station according to the invention are specified in the claims, as are processes according to the invention and an apparatus according to the invention.

BRIEF DESCRIPTION OF THE DRAWINGS

In the following the invention will be described by example in conjunction with the drawings wherein:

FIG. 3a is a schematic illustration of a treatment apparatus equipped with several stations according to the invention;

FIG. 5 is a schematic perspective view of a further development of the sputter coating station according to the invention;

FIG. 6 is a representation analogous to FIG. 5, of a further development of the invention;

FIG. 7 schematically illustrates a preferred embodiment of a station according to the invention;

DESCRIPTION OF THE PREFERRED EMBODIMENTS

The sputter coating station according to the invention described in the following can be used for sputter coating in all known ways. Well-known structures for such coating include evacuation pumps, gas inlets for working and/or reactive gas and the like, and are assumed to be known to the person skilled in the art and are not described.

Figure 1:
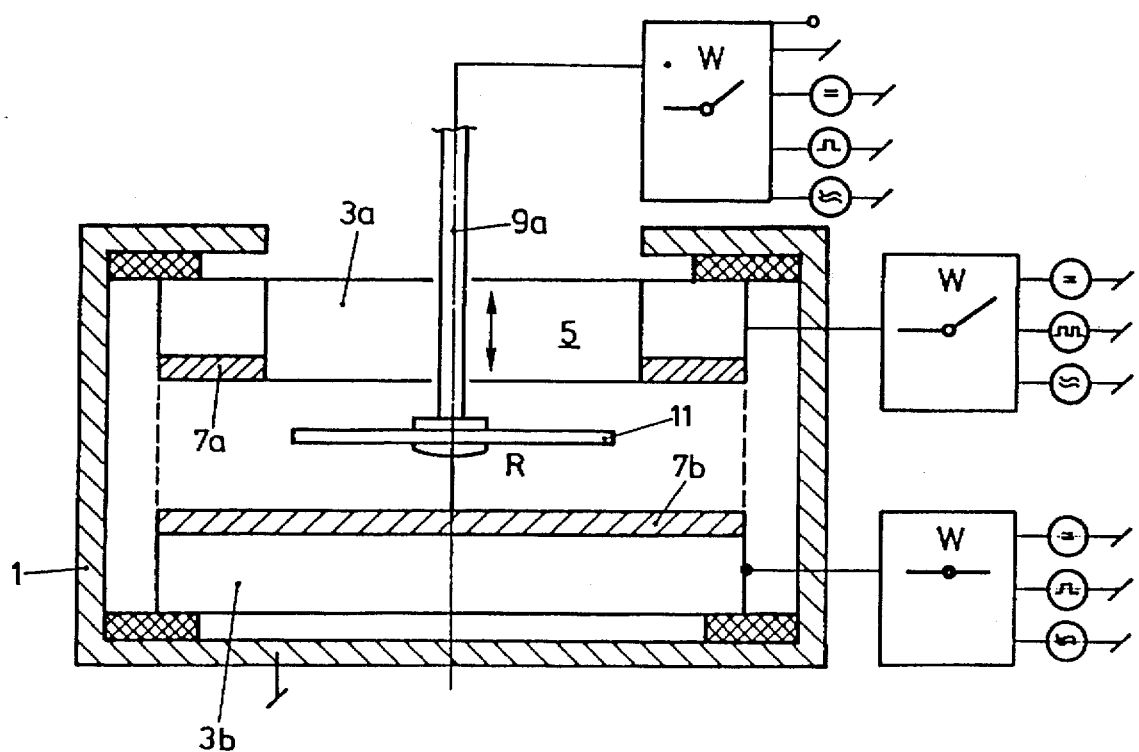
FIG. 1 is a schematic cross-section of the minimum configuration of a station according to the invention.

As shown only schematically in FIG. 1, in a sputter coating station according to the invention, the workpiece can be at floating potential or at a preferably adjustable DC potential or at a preferably adjustable pulsed potential, generally at an AC+DC mixed potential or at a pure AC, for example at an RF potential, using selection option blocks W.

Each target of the sputter sources can optionally be connected to a DC potential or a pulsed potential, generally to an AC+DC mixed potential or to a pure AC, for example to an RF potential.

FIG. 1 shows a sputter coating station according to the invention in a minimum configuration. Two sputter sources 3a and 3b are provided in a vacuum receptacle housing 1 and are positioned opposite each other and are electrically insulated with respect to the housing 1. At least the one sputter source, 3a according to FIG. 1, encompasses a clear opening 5, wherein preferably a target 7a encompasses the clear opening 5 like a frame, for example as a ring or as a rectangular frame, potentially also only partially. The second sputter source 3b is implemented in minimum configuration as a continuously planar source with target 7b.

In the embodiment shown, a workpiece transport device 9a reaches through the clear opening 5 so that at least one surface region of a workpiece to be coated is exposed in or on volume R drawn in dashed lines between targets 7a, 7b in FIG. 1.

The workpiece 11 is depicted in FIG. 1 as a workpiece to be coated preferably with the station according to the invention in the form of a planar disk-shaped substrate. Opening 5 is dimensioned so that the particular workpiece 11 to be coated or the largest workpieces to be coated with such a station can be introduced using the transport arrangement 9a, through opening 5 into volume R.

As will be described in principle in conjunction with FIGS. 2a and 2b, both opposing sputter sources, like the source 3a of FIG. 1, are in a preferred embodiment, constructed with a clear opening.

Figure 2A:
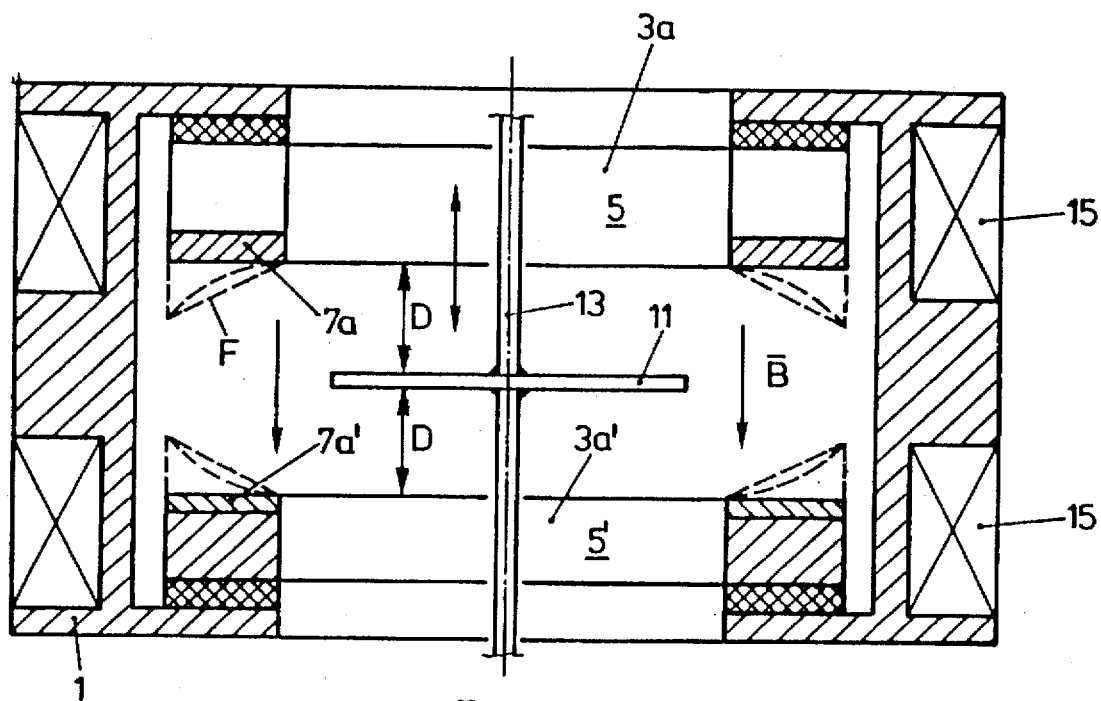
FIG. 2a is a representation analogous to FIG. 1, showing a first preferred embodiment of the station according to the invention.
Figure 2B:
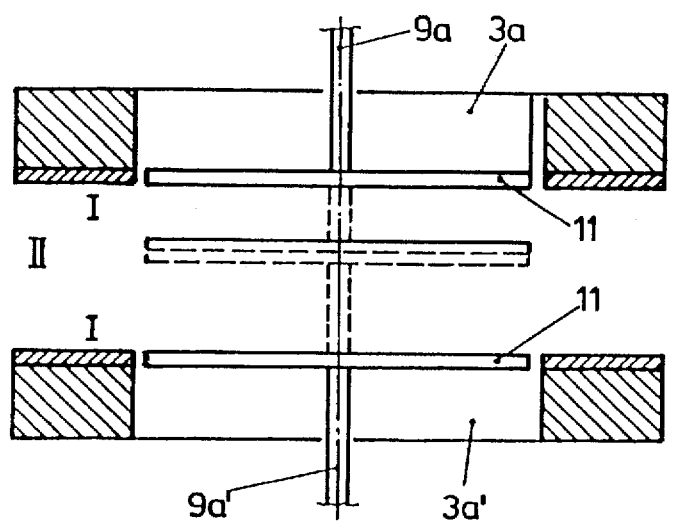
FIG. 2b is a representation analogous to FIG. 2a, of a further preferred embodiment of the station according to the invention wherein only the relative position of sputter sources and a transport arrangement are shown again.

In FIGS. 2a and 2b those structural parts identical to those already described in conjunction with FIG. 1 are denoted by the same reference numerals. The second sputter source, corresponding to 3a', is also provided with an opening 5' in FIG. 2a. The workpiece transport arrangement 13 is realized as a transport rod along which workpieces, in particular disk-shaped workpieces 11, are disposed. Due to the two aligned openings 5 and 5', the transport rod 13 with workpieces 11 are disposed one behind the other, or in continuous operation, can be moved through the station according to the invention.

In the case of the configuration according to FIG. 2a both surfaces of the workpiece disk 11 are simultaneously sputter-coated identically in the case of identical targets 7a, 7a', potentially differently in the case of different targets, especially as far as their material is concerned.

As is shown in dashed lines in FIG. 2a, preferably the sputtered surface F of the target frame is inclined toward the associated clear opening 5, whether this in the new state is planar or already, as also shown in dashed lines, formed concavely in order to improve therewith additionally the attained homogeneity of the layer thickness distribution on the two workpiece surfaces to be coated simultaneously. In addition, in the station according to the invention, also in the embodiment according to FIG. 1, coils 15 are preferably provided with which a magnetic field $\overline{B}$ is generated in the space between the sputter sources with the aid of which the attained coating thickness homogeneity is further optimized. If therein one or both targets comprise magnetic material, they will preferably, as shown schematically at the source 3a', be used simultaneously as pole shoes for the magnetic field $\overline{B}$. As shown, the magnetic field $\overline{B}$ is preferably applied so as to extend from target to target, but can also extend in the form of a tunnel over one or both targets, instead of or in addition to one or both targets.

Building on the representation according to FIG. 2a, in FIG. 2b only the two sputter sources 3a and 3a' are depicted with a further embodiment of the workpiece transport arrangement and a further coating type.

According to FIG. 2b, each source configuration 3a, 3a', is associated with one workpiece carrier arrangement 9a, according to FIG. 1, or 9a'. These arrangements each support one disk-shaped substrate to be coated. With the transport arrangements 9a and 9a' the two substrates 11 are each coated on one of their surfaces initially in the position "I" indicated by solid lines.

If with the transport arrangements 9a, 9a' the two substrates are then placed in contact with one another in the space between the sputter sources, in analogy to the coating according to FIG. 2a and compared with the substrates in position "I", each of the two other surfaces are coated. Consequently, in the procedure according to FIG. 2b in position "I" one of the two substrate surfaces can be coated, and when moved into position "II", the two other surfaces can be coated so that simultaneously two substrates can be coated on both sides.

The embodiment according to FIG. 2a is highly suitable as a station in a multi-station production installation such as is shown schematically in FIG. 3a.

A workpiece disk 11 to be coated is placed by means of an automatic loading system 17 onto a pivotable cover 19, and specifically onto a portion 13a of the transport arrangement with end-position piston-like sealing disk 21. After closing the cover 19 in the direction of the curved arrow the treatment space 23 of the apparatus is evacuated with a first pump 25. By driving the plunger 13 forward, the portion 13a with the disk 11 is received by plunger portion 13b and moved to the right in the figure. The disk 11 is thereby moved into a first sputtering station 27 constructed according to FIG. 2a with sputter sources 3a and 3a' at distances D, D from the surfaces of disk 11, and is therein subjected to a first coating. By further movement of the transport plunger 13 to the right the substrate is subsequently moved sequentially into the further sputter station 29 according to the invention and finally into sputter station 31.

The piston-like sealing disk 21 as well as a corresponding piston-like sealing part 21a on portion 13b of the transport plunger 13 seal each station according to FIG. 2a from the remaining installation stations as is shown in FIG. 3a. A process pump unit 33 conditions the sputter stations 27, 29, 31 jointly or selectively.

The coils for controlling the particular coating thickness homogeneity are again denoted by 15.

As can be seen in particular in FIG. 3a, the individual station of the invention and according to FIGS. 2a or 2b, but especially the successive arrangement of several such stations such that two sources are disposed practically back to back, permits the electrical insulation of the sputter sources with optimally low expenditures. This is shown schematically in FIG. 3a at 35. This also permits the stations to be cooled jointly and to be electrically connected with optimally combined electrical sources in order to operate them. It is readily possible, for example, to operate sources disposed back to back from the same generator practically like an integral source. It is also possible, if necessary, to omit the intermediate insulation 35 and the two adjacent sputter sources can be operated at the same potential. In that case it is only necessary to ensure insulation against the apparatus wall 37. At the individual sputter stations the substrates are preferably provided with different coatings.

Figure 3B:
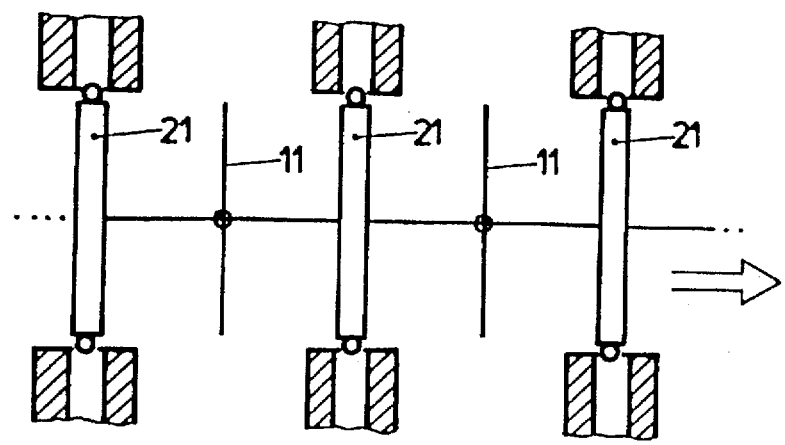
FIG. 3b is an illustration building on an apparatus according to FIG. 3a, showing a further development for simultaneously treating several workpieces at different stations.

When considering FIG. 3a it is immediately evident that it is also possible to dispose several substrates 11 on the same transport plunger 13, 13b in the form of stacks such that at several sputter stations according to 27 to 31, substrates are coated simultaneously. This is shown schematically in FIG. 3b.

It is understood that after the processes to be carried out at the stations according to the invention and the remaining treatment stations provided at the apparatus according to FIG. 3a, the particular chamber separations through the sealing piston 21 or 21a can be realized to the extent required either in a form- or force-fitting manner or by means of gap sealings or not at all.

Figure 4:
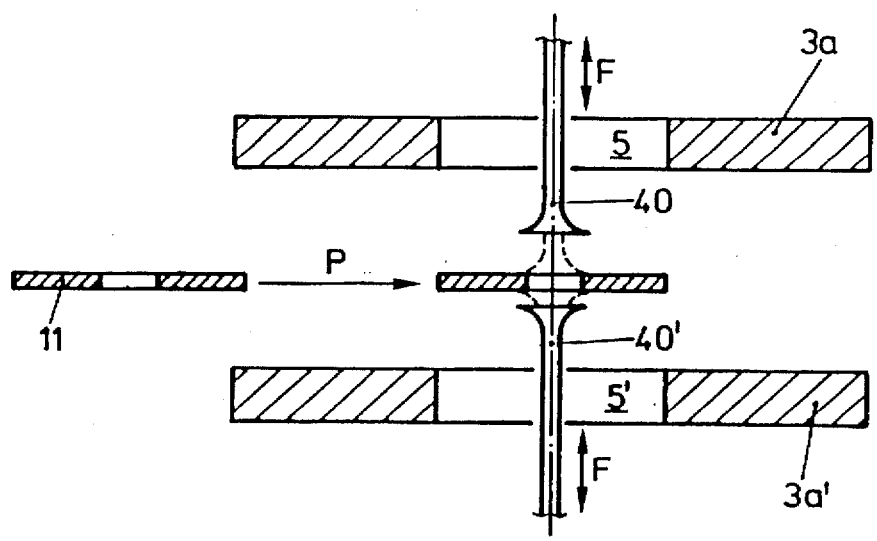
FIG. 4 schematically illustrates a further development of the sputter coating station according to the invention.

Building on an embodiment of the sputter coating station according to FIG. 2a, FIG. 4 schematically depicts a further embodiment in particular relating to workpiece transport and workpiece mounting during the coating process.

A substrate disk 11, for example in the form of a CD or another storage disk, is laterally inserted between the target or sputter sources 3a or 3a', implemented according to the invention, with a transport device schematically illustrated by arrow P. It is centered with respect to openings 5, 5' while being clamped between two movably driven masking plungers, as indicated schematically by arrows F. Therewith the central disk region is masked, for one, and simultaneously the disk 11 is positioned during the coating process. It is understood that it is also readily possible to carry out the active clamping between the masking plungers 40, 40' in that the one remains stationary and only the second acts against the stationary one while clamping the disk 11 between them.

FIG. 5 shows schematically and in perspective a further embodiment of a sputter coating station according to the invention. The targets or sputter sources 43a or 43a', each provided with an opening 45 or 45', are rectangular in this embodiment and encompass openings which are likewise rectangular.

For example on a mounting and transport plate 47 one or several substrate sheets 51 disposed on both sides are moved essentially perpendicularly to the target or sputtering surfaces through openings 45, 45' and coated in the process. The magnetic field $\overline{B}$ is again shown in the preferred orientation and the targets can be used directly as magnetic pole shoes and are for this purpose comprised of magnetic material.

FIG. 6 shows a further embodiment of the target functioning analogously to the embodiment shown in FIG. 5. In this embodiment, as shown by example, the opposing sputtering surfaces are formed concavely, in order to achieve for example specifically desired layer thickness distributions on the intermediately placed workpiece.

At this point a further advantage of the sputter coating station implemented according to the invention may be mentioned: It is entirely possible to ensure through the mutual coating of the targets that these are operated in metallic mode. This can be ensured even if in the center region, i.e. in the region of the openings, a reactive gas flow or a partial pressure of the reactive gas is set such that there, coating takes place in reactive or in intra-mode, also due to the lower rate of sputtered material obtaining there. In metal mode an insulating disturbance coating of the targets is prevented with concomitant disturbance spark formation.

The approach according to FIG. 5 or FIG. 6 is especially suitable for layers and substrates which react sensitively to plasma influences such as comprising indium/tin oxide, tellurium etc. The plasma density in the central region of the targets is essentially vanishing and the surfaces to be coated are parallel to the homogeneous magnetic field.

In FIG. 7 the arrangement of the targets 3a or 3a' is again shown schematically with preferably provided electrode arrangement 53 or 53' encompassing the inner and outer periphery of the targets and kept with respect to them at least at the distance of the dark space. According to FIG. 7 the electrodes as well as the two targets 3a, 3a' are operated from a single source 55, the electrodes 53, 53' as anodes, the targets as cathodes. It is understood that it is also readily possible to operate the electrodes 53, 53' at floating potential as shields or as third electrodes electrically activated, for example at a bias DC potential.

Figure 8A:
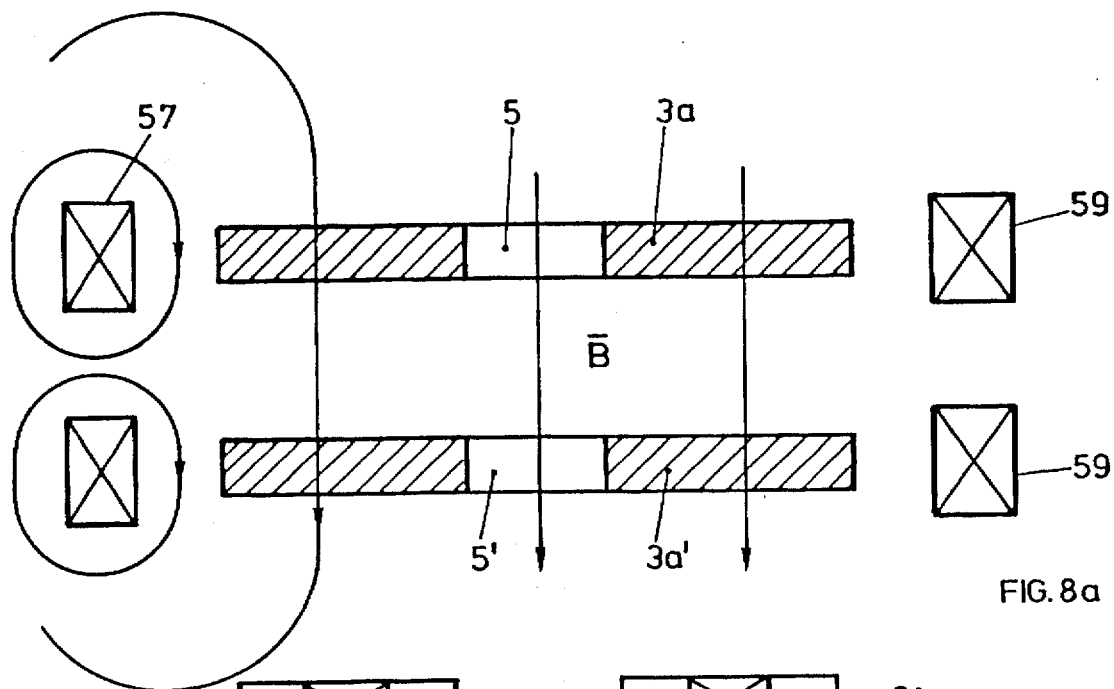
FIG. 8a schematically illustrates a first fundamental magnetic field orientation at a station according to the invention.

FIG. 8a schematically shows the arrangement of a first magnet configuration 57 by means of which a magnetic field $\overline{B}$ is generated between the targets 3a, 3a' which extends essentially perpendicularly to the new target surfaces, i.e. axis-parallel to the axis of the openings 5 or 5'. As is shown, this magnetic field can be generated by coils 59 or by appropriately disposed permanent magnets or by a combination of electro- and permanent magnets.

Figure 8B:
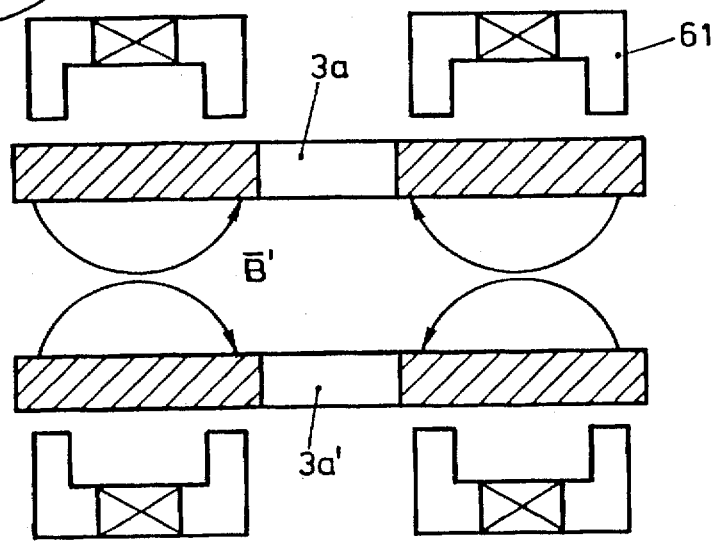
FIG. 8b is a representation analogous to FIG. 8a of a second fundamental magnetic field orientation.

A second fundamental way of providing a magnetic field, according to B' of FIG. 8b, corresponds to that on a planar magnetron in which the magnetic field lines extend on at least one of the targets 3a, 3a' in the form of a tunnel. As is shown schematically at 61, this is realized in a known manner through static or moving permanent and/or electromagnet configurations associated with each target. It is understood that orientations of magnetic fields according to FIG. 8a and according to FIG. 8b can be combined in any desired way. In particular in the case of electromagnets, adjusting interventions or time-variable magnetic fields, such as pulsed magnetic fields, can be realized through corresponding drives.

Figure 10:
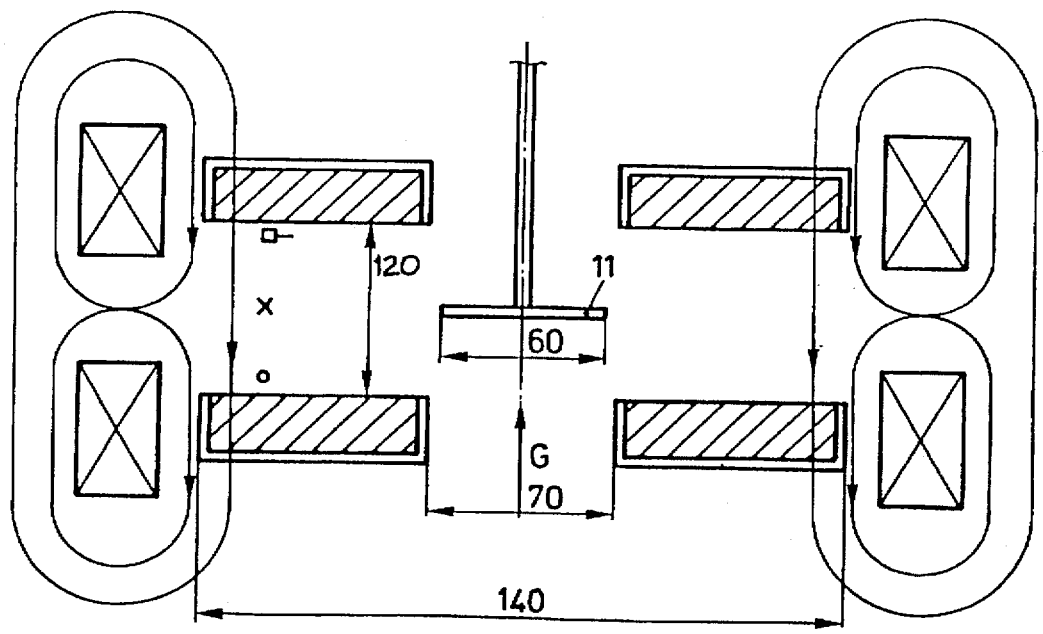
FIG. 10 illustrates the station configuration used for determining the orientations according to FIGS. 11 and 12.

FIG. 10 schematically shows a sputter coating station according to the invention which corresponds to a combination of the arrangements described in conjunction with FIG. 7 and FIGS. 8a and 8b. The dimensions are indicated in millimeters.

Figure 12:
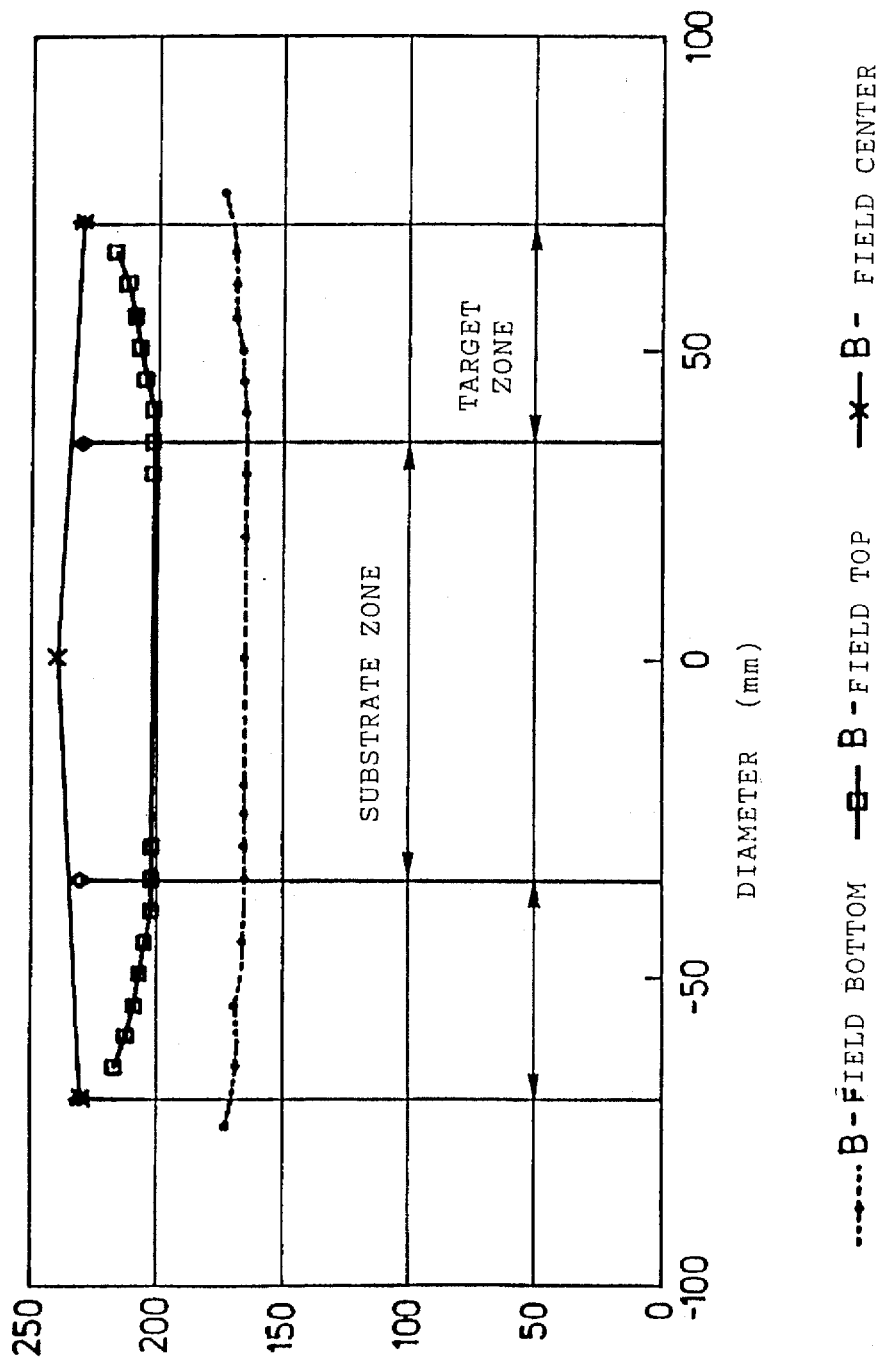
FIG. 12 is a graph plotting the magnetic field distribution at the station according to FIG. 10 for achieving a layer thickness distribution according to FIG. 11.

In FIG. 12 the magnetic field or its orientation measured at the correspondingly marked regions according to FIG. 10 and correspondingly realized, is shown. Aluminum targets were sputtered and a pressure of $8 \times 10^{-3}$ mbars was set in the process chamber.

Figure 11:
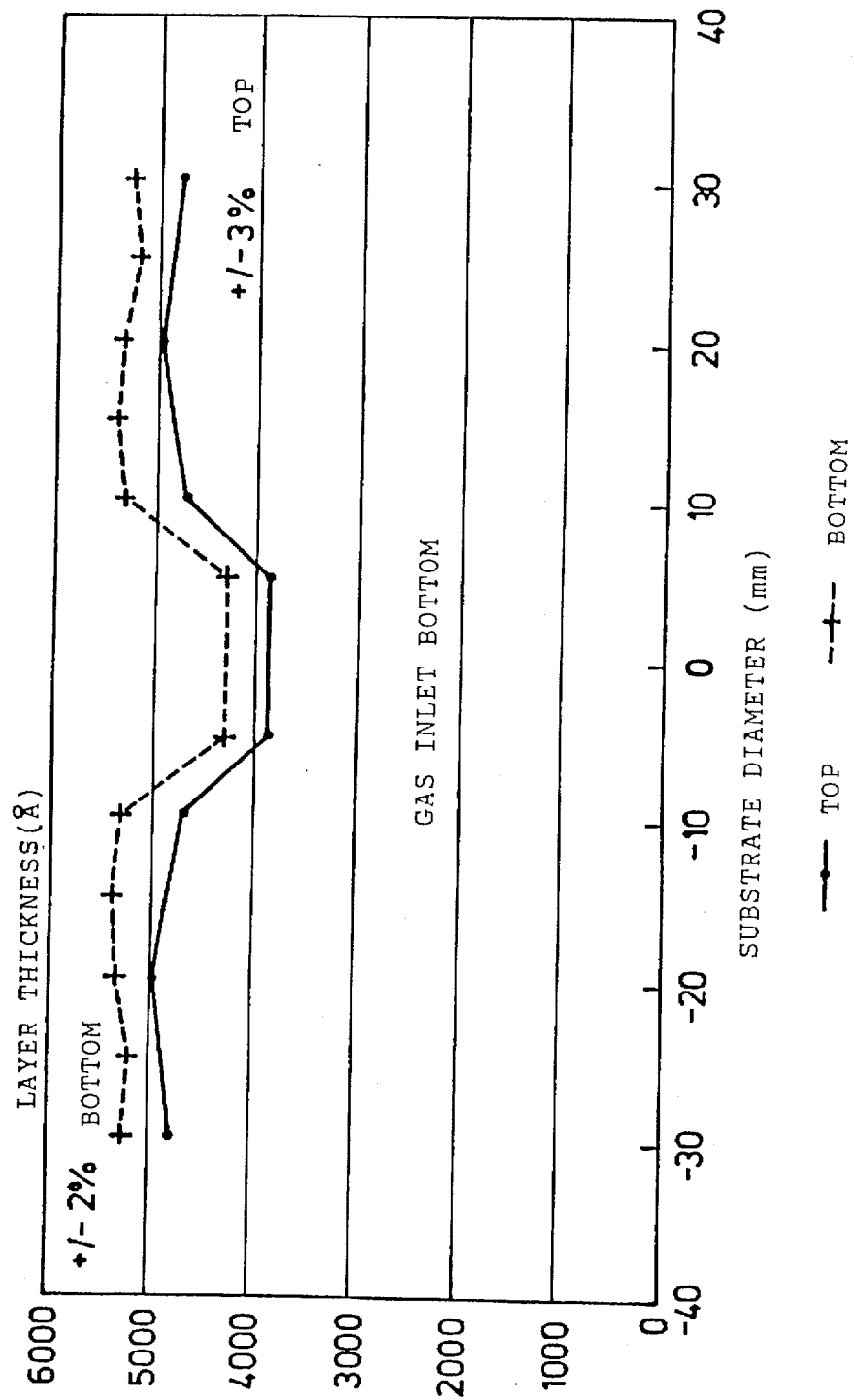
FIG. 11 is a graph plotting the layer thickness distribution obtained in the station according to FIG. 10 with a magnetic field distribution as depicted in FIG. 12.

In FIG. 11 the resulting layer thickness distribution on the substrate 11 according to FIG. 10 is shown wherein, with the exception of a central mounting, the central region was not masked as is indicated in FIG. 10. As a result, as is readily evident, an extremely homogeneous, essentially uniform coating of both substrate surfaces is obtained.

Figure 9:
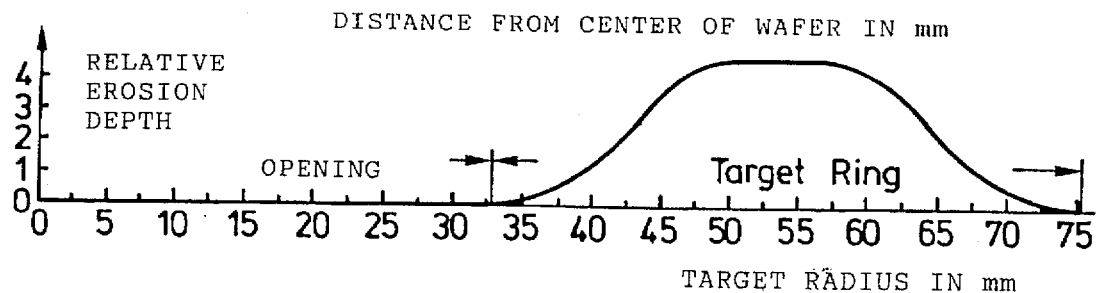
FIG. 9 is a graph plotting a qualitative erosion profile attained as a function of the radius of a circular target in a station according to one of FIGS. 1 to 2b.

In FIG. 9 the erosion depth as a function of the target ring radius is shown; good, essentially uniform erosion and thus utilization of the target material results.

The sputter coating station according to the invention is especially suitable for the coating of disk-shaped workpieces, in particular for coating hard disks, minidisks, and CDs.

In summary, with the station according to the invention the following advantages are obtained:

compact construction;

simultaneous all-around coating of workpieces, in particular simultaneous coating of both surfaces of disk-shaped workpieces or simultaneous coating of the surfaces of two, in particular disk-shaped, workpieces, and potentially subsequent simultaneous coating of their other surfaces, by means of circular annular targets as well as also by means of rectangular frame-like targets according to FIG. 5;

due to the plasma pinching which is controllable with the magnetic fields, coating can take place at very low partial pressures of the working gas;

the layer thickness distribution can be optimized with the magnetic fields shown;

the homogeneous target stripping yields a high target utilization and magnetic target materials can be sputtered;

electric operating sources can be optimized for use in operating several sputtering sources;

conductance of cooling circulations over several sources can be optimized;

a sufficiently homogeneous layer thickness distribution is ensured even without workpiece movement;

the construction of mutual insulation of the sources is simple;

coating of a substrate on two surfaces or coating of two substrates on one surface can be realized by providing a single electrical operating source;

extremely thick targets can be used, for example of a thickness up to 6 cm, because in the preferred embodiment in which the field lines of the magnetic field are directed from target surface to target surface, the orientation of the field now depends only insignificantly on the instantaneous erosion form and the target thickness;

if a substrate to be coated is to be guided in a homogeneous magnetic field during layer growth, as is desirable for example for high density hard disks, this is possible without auxiliary devices through the procedure according to FIG. 5;

by connecting in series several sputter coating stations according to the invention all targets can be operated with the same electrical source wherein the plasmas are optionally activated or deactivated by switching the magnetic fields on and off; and due to the differing conditions in the opening region of the targets and in the sputtering surface regions in the opening region a layer deposition can occur in reactive mode with electrically insulating material, wherein the known target poisoning in the sputtering surface region essentially does not occur.

What is claimed is:

1. A sputter coating station comprising:
 a pair of opposing sputter sources;
 at least one of said sources (3a) defining a clear opening (5) therethrough; and
 workpiece mounting means (9a, 13, 13a, 13b, 40, 47), adapted to reach into said clear opening (5) for moving a workpiece through said clear opening (5).

2. A station as stated in claim 1, wherein the workpiece mounting means comprise a positioning plunger (40) for reaching through the opening (5) and engaging a workpiece.

3. A station as stated in claim 1, wherein both sputter sources comprise a clear opening (5,5'), said workpiece mounting means (9a, 9a', 13a, 13b, 40, 40') being for reaching into one of the openings (5, 5') or jointly (13, 47) reaching in through both openings (5, 5').

4. A station as stated in claim 3, wherein the workpiece mounting means is formed for receiving workpiece disks with disk surfaces that are substantially perpendicular to an axis of the openings (5, 5').

5. A station as stated in claim 1, wherein the at least one sputter source comprises a frame-shaped target at least partially surrounding the opening.

6. A station as stated in claim 5, wherein the frame-shaped target is rectangular.

7. A station as stated in claim 5, wherein the frame-shaped target is annular.

8. A station as stated in claim 1, wherein the at least one of the sputter sources has a target with a sputter surface that is inclined toward the opening before the sputter source is used.

9. A station as stated in one of claim 8, wherein the inclined sputter surface is straight in radial cross-section.

10. A station as stated in claim 8, wherein the inclined sputter surface is concave in radial cross-section.

11. A station as stated in claim 1, wherein the opening has an axis and said mounting means comprises a transport arrangement movably driven substantially parallel to the opening axis.

12. A station as stated in claim 1, wherein the opening has an axis and including a magnetic field generation arrangement positioned to generate a magnetic field between the sputter sources, parallel to the opening axis.

13. A station as stated in claim 1, wherein the opening has an axis and including a magnetic field generation arrangement position to generate a magnetic shield which is arched in the form of a tunnel over a target surface of the sputter sources.

14. A station as stated in claim 1, including a magnetic field generation means comprising at least one of an electromagnetic and a permanent magnet.

15. A station as stated in claims 1, wherein said mounting means includes a workpiece transport arrangement movably driven laterally between the sputter sources, said workpiece mounting means having means for movement in such a way as to reach through at least the one clear opening for receiving and positioning the workpiece during a coating operation.

16. A station as stated in claim 1, wherein the opening has an edge, and an electrode arrangement provided at least at the distance of a dark space of the electrode from and along the edge.

17. A station as stated in claim 16, including means for operating the electrode as an anode.

18. A station as stated in claim 1, including housing means for forming a vacuum treatment apparatus for treating a surface of the workpiece, around the sources.

19. A station as stated in claim 1, wherein the workpiece mounting means are adapted for moving a disk-shaped workpiece having a central axis, said clear opening having an axis and the workpiece mounting means moving the workpiece so that the central axis of the workpiece is coincident with the axis of the opening.

20. A process for sputter coating workpieces, comprising:
holding a workpiece in a coating chamber by holding means adapted to pass through an opening in a first sputter source in the chamber;
exposing the workpiece, except for a mounting region for holding the workpiece, to coat the workpiece by material sputtered from said first sputter source; and
providing a further sputter source which is opposite the first source in the chamber.

21. A process as stated in claim 20, including forming an annular plasma discharge, and, in the discharge, sputtering electrically conducting sputtered material, the sputtered material in a central region of a ring formed by the first sputter source is allowed to react with a reactive gas and in the central region of the discharge, a workpiece is coated with a reaction product of the reactive gas and the sputtered material.

22. A process as stated in claim 21, wherein the reaction product of the sputtered material and reactive gas is less electrically conductive than the sputtered material.

23. A process as stated in claim 21, wherein, in the annular plasma discharge region a magnetic field is generated which is substantially axis-parallel with respect to an axis of the ring.

24. A process as stated in claim 20, wherein the workpiece comprises a disk-shaped workpiece with a central axis, the opening in the first sputter source having an axis, the process including moving the workpiece with its central axis coincident with the axis of the opening in the first sputter source.

25. A process according to claim 24 wherein the disk-shaped workpiece comprises a storage disk.

26. A sputter coating station comprising:
a pair of opposing sputter sources;
at least one of said sources (3a) defining a clear opening (5) therethrough; and
workpiece mounting means (9a, 13, 13a, 13b, 40, 47), for reaching into said clear opening (5) for moving a workpiece through said clear opening (5);
the workpiece mounting means comprising a positioning plunger (40) for reaching through the opening (5) and engaging a workpiece;
said positioning plunger comprising a mask for masking a workpiece against which the plunger is engaged.

27. A station as stated in claim 26, wherein both of said sputter sources define clear openings (5, 5') therethrough, said workpiece mounting means including a second plunger (40') for reaching through the opening of the other one of said sputter sources and for engaging a workpiece which is also engaged by said positioning plunger.

* * * * *